United States Patent
Gomes et al.

(10) Patent No.: US 11,901,347 B2
(45) Date of Patent: Feb. 13, 2024

(54) MICROELECTRONIC PACKAGE WITH THREE-DIMENSIONAL (3D) MONOLITHIC MEMORY DIE

(71) Applicant: Intel Corporation, Santa Clara, CA (US)

(72) Inventors: Wilfred Gomes, Portland, OR (US); Mauro J. Kobrinsky, Portland, OR (US); Doug B. Ingerly, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 732 days.

(21) Appl. No.: 16/887,339

(22) Filed: May 29, 2020

(65) Prior Publication Data

US 2021/0375849 A1    Dec. 2, 2021

(51) Int. Cl.
*H01L 25/18*    (2023.01)
*H01L 23/00*    (2006.01)
*H01Q 1/24*    (2006.01)

(52) U.S. Cl.
CPC ............. *H01L 25/18* (2013.01); *H01L 24/16* (2013.01); *H01L 2224/16145* (2013.01); *H01L 2924/1436* (2013.01); *H01Q 1/24* (2013.01)

(58) Field of Classification Search
None
See application file for complete search history.

(56) References Cited

U.S. PATENT DOCUMENTS

| | | | |
|---|---|---|---|
| 2013/0083587 A1* | 4/2013 | Sekar | G11C 5/025 365/182 |
| 2017/0352644 A1 | 12/2017 | Lin et al. | |
| 2018/0158751 A1* | 6/2018 | Groothuis | H01L 23/49827 |
| 2019/0244933 A1* | 8/2019 | Or-Bach | H01L 27/0688 |

FOREIGN PATENT DOCUMENTS

WO    2019074506 A1    4/2019

OTHER PUBLICATIONS

Daneshtalab, M., et al., "High-Performance On-Chip Network Platform for Memory-on-Processor Architectures," IEEE; 6 pages (Jun. 20, 2011).
European Extended Search Report issued in EP Application No. 20211410.4 dated May 14, 2021; 11 pages.
Woo, D., et al., An Optimized 3D-Stacked Memory Architecture by Exploiting Excessive, High-Density TSV Bandwidth, IEEE 16th International Symposium; 12 pages (Jan. 9, 2010).

* cited by examiner

*Primary Examiner* — Hung K Vu
(74) *Attorney, Agent, or Firm* — Akona IP

(57) ABSTRACT

Embodiments may relate to a microelectronic package. The microelectronic package may include a memory die with: a first memory cell at a first layer of the memory die; a second memory cell at a second layer of the memory die; and a via in the memory die that communicatively couples an active die with a package substrate of the microelectronic package. Other embodiments may be described or claimed.

19 Claims, 6 Drawing Sheets

MICROELECTRONIC PACKAGE WITH THREE-DIMENSIONAL (3D) MONOLITHIC MEMORY DIE

BACKGROUND

Mobile devices such as smart phones may include significant amounts of memory. For example, some mobile devices may have between approximately 4 and approximately 16 gigabytes (GB) of package-on-package (POP) memory.

DETAILED DESCRIPTION

Figure 1:
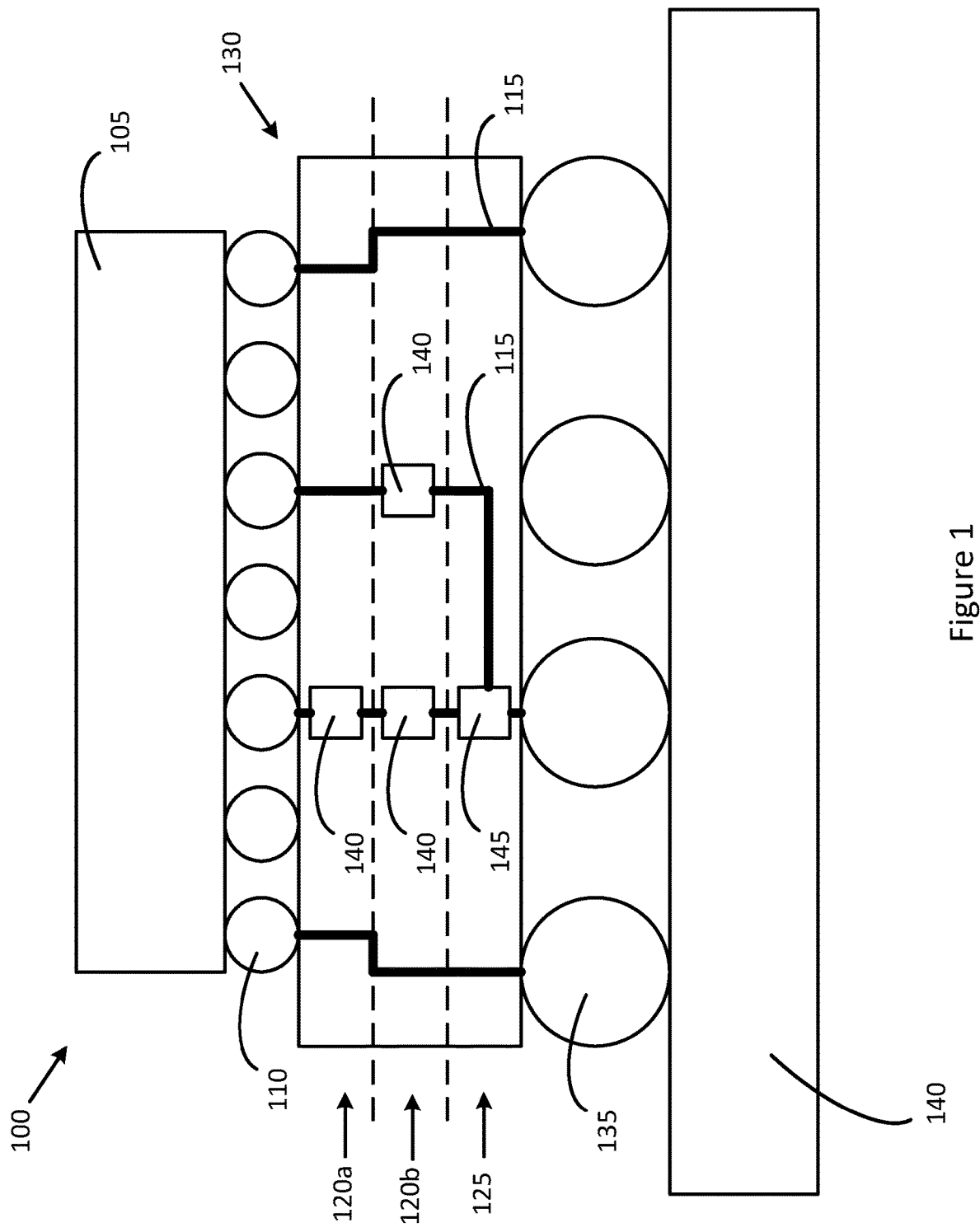
FIG. 1 depicts an example microelectronic package with a three-dimensional (3D) monolithic memory die, in accordance with various embodiments.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature [[formed/deposited/disposed/etc.]] on a second feature," may mean that the first feature is formed/deposited/disposed/etc. over the feature layer, and at least a part of the first feature may be in direct contact (e.g., direct physical or electrical contact) or indirect contact (e.g., having one or more other features between the first feature and the second feature) with at least a part of the second feature.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise. Additionally, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined, e.g., using scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

As noted, mobile devices may include significant amounts of memory such as 4-16 GB of POP memory. However, POP memory may typically use wire bonding to communicatively couple cells of the POP memory to a pad or interconnect that couples the POP memory to another element of the microelectronic package such as a package substrate, which may have disadvantages with respect to cost and z-height of the memory. Additionally, the number of connections between the dies may be necessarily limited based on the use of wire bonding.

By contrast, embodiments herein may relate to a 3D monolithic memory die that is connected face-to-face with an active die such as a system-on-chip (SOC) by microbumps. The memory die may include multiple layers of memory cells that are communicatively or physically coupled with one another by conductive elements such as vias. The memory die may further include one or more vias through which the active die may be communicatively coupled with the package substrate. The 3D monolithic memory die, may provide a number of benefits. For example, the 3D monolithic memory die may allow for a reduced overall z-height for the package by using a face-to-face interconnect between the active die and the memory die rather than, for example, wirebonds. Additionally, the 3D monolithic memory die may allow for higher performance, higher bandwidth, and lower power use than a traditional POP memory.

Some embodiments herein may enable between a 10× to a 100× increase in bandwidth as compared to legacy POP memory. As one example, embodiments herein may allow between 100 to 10000 wires that provide for a bandwidth of approximately 500 GB per second (Gb/s). The large wire count may be enabled by the three-dimensional nature of the interconnect of embodiments herein. Embodiments may also allow for lower power based on the use of lower voltages FIG. 1 depicts an example microelectronic package 100 with a three-dimensional (3D) monolithic memory die, in accordance with various embodiments. For the sake of readability, the 3D monolithic memory die will be referred to as "memory die 130" herein. It will be understood that the depiction of the microelectronic package 100 is intended as a high-level, highly simplified, example depiction. Unless otherwise explicitly stated, the relative sizes, shapes, quantities, or positions of various elements is not meant to be implied within the Figure. Additionally, it will be understood that real-world embodiments may include elements that are not depicted within the Figure such as various conductive elements, mold material, underfill, active or passive elements, etc.

The microelectronic package 105 may include an active die 105. The active die 105 may be or include, for example, a processor such as a central processing unit (CPU), graphics processing unit (GPU), a core of a distributed processor, or some other type of processor. In some embodiments the active die 105 may be or include a radio frequency (RF) chip or RF circuitry that is configured to generate, process, transmit, or receive a wireless signal such as a third generation (3G), a fourth generation (4G), a fifth generation (5G), a Wi-Fi, or some other type of wireless signal. In some embodiments the die 105 may include one or more passive components such as capacitors, resistors, etc. The various active or passive components may be positioned within, partially within, or on the surface of the active die 105. In some embodiments, the active die 105 may be, or may be referred to as, a SOC.

The microelectronic package 100 may be coupled with, or may include, a package substrate 140. The package substrate 140 may be, for example, considered to be a cored or coreless substrate. The package substrate 140 may include one or more layers of a dielectric material which may be organic or inorganic. The package substrate 140 may further include one or more conductive elements such as vias, pads, traces, microstrips, striplines, etc. The conductive elements may be internal to, or on the surface of, the package substrate. Generally, the conductive elements may allow for the routing of signals through the package substrate 140, or between elements that are coupled to the package substrate 140. In some embodiments the package substrate 110 may be, for example, a printed circuit board (PCB), an interposer, a motherboard, or some other type of substrate.

The microelectronic package 100 may further include a memory die 130. Similarly to the description of the package substrate 140, the memory die 130 may be formed one or more layers of an organic or inorganic dielectric material. In some embodiments, the layers may be physically different from one another, e.g. laminated or deposited at different times, while in other embodiments the memory die 130 may be a unitary element such that the layers discussed herein are only logical separations for the sake of discussion.

Specifically, the memory die may include a complimentary metal-oxide semiconductor (CMOS) layer 125 and a number of n-type metal-oxide-semiconductor (NMOS) layers 120a and 120b (collectively, "NMOS layers 120"). Generally, the CMOS layer 125 may have a number of CMOS elements or circuits which may act as control logic for the memory die 130. One such logic is logic 145 which may be or include circuitry which may control memory cells of the NMOS layers 120. For example, the logic 145 may be a decoder, a sensing amplifier, or some other type of logic. It will be understood that although only two NMOS layers are depicted in FIG. 1, real-world embodiments may have between one and four layers, while other embodiments may have up to 128 layers or beyond. Additionally, it will be understood that the memory die may have additional layers such as routing layers or other types of layers that are not depicted in FIG. 1.

The NMOS layers 120a/120b may include a number of memory cells 140. Generally, respective ones of the memory cells 140 may be an NMOS dynamic random-access memory (DRAM). Specifically, respective ones of the memory cells 140 may be DRAM memory that includes an NMOS transistor, which may also be referred to as an n-type transistor. The NMOS DRAM may have a memory capacity between approximately 1 Gb and approximately 128 GB. In some embodiments, the memory cells 140 may be implemented using passive and active elements that that within the dielectric material of the memory die 130. In other embodiments, the memory cells 140 may be implemented as distinct dies that are within a larger die package of the memory die 130. It will be understood that although respective ones of the NMOS layers 120 are depicted as having one or two memory cells each, in other embodiments an NMOS layers 120 may have between approximately 128 and approximately 1024 memory cells. It will also be understood that one or more of the NMOS layers may have the same number, or a different number, of memory cells as another of the NMOS layers.

The various memory cells 140 may be communicatively coupled with one another by one or more conductive elements 115 as shown. The conductive elements 115 may be, or include, a conductive material that allows for communication between elements of the memory die. The conductive elements 115 maybe formed of a material such as copper, gold, etc. The conductive elements 115 may include, for example, microstrips, striplines, vias, traces, pads, etc. As may be seen, the conductive elements 115 may communicatively couple a variety of elements of the of memory die 130 to one another, or allow communication through the memory die 130 between different elements of the microelectronic package 100. As one example, conductive elements 115 may couple a variety of the memory cells 140 with one another, or memory cells 140 to a logic 145. Additionally or alternatively, conductive elements 115 may allow for communication through the memory die 130 between the active die 105 and the substrate 140. It will be recognized that the layout and number of the conductive elements 115 is highly simplified in the depiction of FIG. 1, and real-world embodiments may include significantly more complicated routing paths with respect to the conductive elements 115.

The memory die 130 may be coupled with the package substrate 140 by one or more interconnects 135. The interconnects 135 may be, for example, solder bumps that are formed of a material such as tin, silver, copper, etc. If solder bumps are used for the interconnects 135, then the solder bumps may be elements of a ball grid array (BGA) as shown in FIG. 1. In other embodiments, the interconnects 135 may be pins of a pin grid array (PGA), elements of a solder grid array (SGA), or some other type of interconnect. Generally, the interconnects 135 may physically or communicatively couple the memory die 130 with the package substrate 140. For example, one or more of the interconnects 135 may physically couple with, and allow electrical signals to pass between, pads of the memory die 130 and pads of the package substrate 140 (pads not shown for the sake of elimination of clutter of FIG. 1). In other embodiments, the interconnects 135 may physically couple the memory die 130 and the package substrate 140, but the interconnects 135 may not communicatively couple the memory die 130 and the package substrate 140.

Similarly, the memory die 130 may be coupled with the active die 105 by interconnects 110. Generally, the interconnects 110 may be similar to, and share one or more characteristics with, interconnects 135. Specifically, the interconnects 110 may be formed of a solder mater such as tin, silver, copper, etc. Additionally, the interconnects 110 may be elements of a BGA (as shown), while in other embodiments they may be elements of a PGA, SGA, etc. In embodiments, the interconnects 110 may allow for a face-to-face connection between the memory die 130 and the active die 105. That is, an active side of the memory die 130 may be coupled with an active side of the active die 105 by the interconnects 110. As may be seen, in some embodiments the interconnects 110 may be smaller than interconnects 135, while in other embodiments interconnects 110 may be the same size as, or larger than, interconnects 135.

Generally, embodiments herein may provide a number of advantages over legacy POP memory as described above. Specifically, by allowing for interconnection between the various memory cells 140 through conductive elements such as conductive elements 115, rather than wirebonds as may have been used in legacy POP memory, the overall z-height of the memory die 130 (e.g., the height of the memory die 130 as measured perpendicularly to the face of the package substrate 140 to which the microelectronic package 100 is coupled) may be lower than that of a legacy POP memory. For example, memory die 130 may have a memory capacity of between 4 GB and 16 GB, with a z-height between approximately 100 and approximately 150 micrometers ("microns"). This is compared to the z-height of a legacy POP memory which may be between approximately 400 microns to approximately 1 millimeter ("mm").

As previously noted, FIG. 1 depicts a highly simplified example embodiment, and other embodiments may include variations from the microelectronic package 100. For example, the number, positioning, relative sizes, etc. of various elements of FIG. 1 may be different in different embodiments. For example, different embodiments may have more or fewer interconnects 110/135, memory cells 140, conductive elements 115, NMOS layers 120, etc. Additionally, in other embodiments the relative arrangement of various elements may be different. For example, the active die 105 may be positioned between the memory die 130 and the substrate 140. In some embodiments, the memory die 130 may be split such that the active die 105 is between one or more layers of the memory die 130. Other variations may be present in other embodiments.

Figure 2:
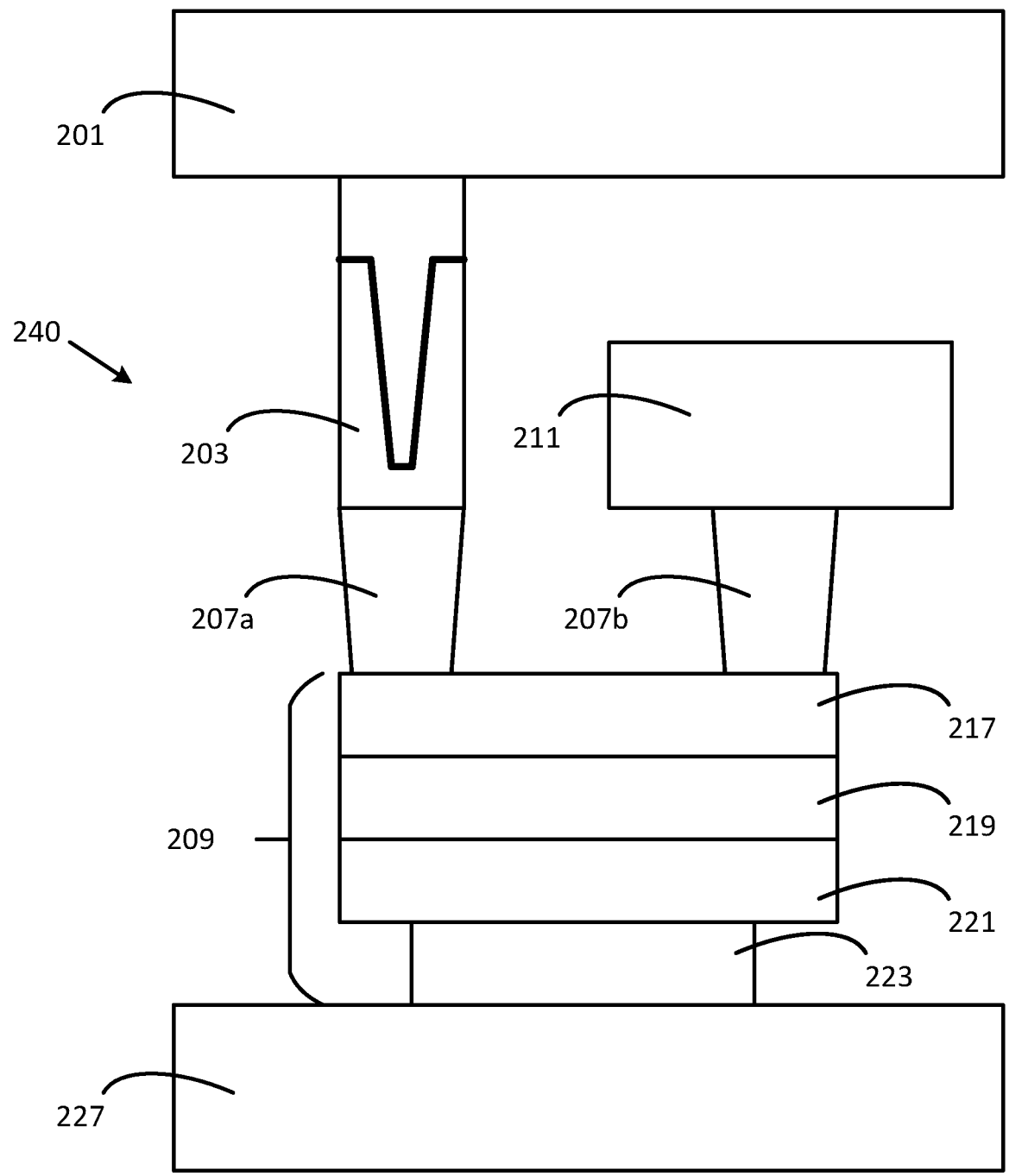
FIG. 2 depicts an example of a memory cell of a 3D monolithic memory die, in accordance with various embodiments.

FIG. 2 depicts an example of a memory cell 240, in accordance with various embodiments. Generally, the memory cell 240 may be similar to, and share one or more characteristics with, memory cell 140 of FIG. 1.

The memory cell 240 may include a capacitor 203. The capacitor 203 may be, for example, a metal-insulator-metal (MIM) capacitor or some other type of capacitor. The capacitor 203 may be coupled with a transistor 209 by a contact 207a. The contact 207a may be, for example, a conductive element such as a via. Specifically, the contact 207a may be coupled with a source or drain terminal of the transistor 209.

Opposite the transistor, the capacitor 203 may be coupled with a cell plate 201. The cell plate 201 may be, for example, a polysilicon material and may be considered to be a source line. Specifically, the cell plate 201 may be to provide a control or reference voltage to a transistor of the memory cell 240 such as transistor 209.

The transistor 209 may include a number of elements or layers such as a thin film transistor layer 217. For example, the thin film transistor layer 217 may also be referred to as a "silicon transistor" layer and may be fabricated using layering. In some embodiments, the thin film transistor layer 217 may be, or may include, indium gallium zirconium oxide (IGZO). The thin film transistor layer 217 may be, or may include, the source or drain (or both) of the transistor 209. The thin film transistor layer 217 may be coupled with the contact 207a, and may further include a contact 207b (which may be similar to contact 207a) which may be coupled with a bitline 211 of the microelectronic package of which the memory cell 240 is a part. For example, in some embodiments the source of the transistor 209 may be communicatively coupled with contact 207a, while the drain of the transistor 209 may be communicatively coupled with the contact 207b (or vice-versa).

The transistor 209 may further include a gate dielectric material 219. The gate dielectric material 219 may be, for example, silicon nitride, aluminius oxide, hafnium silicate, hafnium dioxide, zirconium dioxide, zirconium silicate, etc., or some other appropriate material. The transistor 209 may further include a metal gate 221 which may be, for example, indium tin oxide, indium zinc oxide, etc., or some other material. The transistor 209 may further include a gate contact 223 which may be, for example, tantalum nitride or some other material. The gate contact 223 may be coupled with a wordline 227 of the microelectronic package.

Generally, a voltage on the wordline 227 may indicate whether the memory cell 240 is being written to, or read from. For example, a "high" voltage (e.g., a logical "1") may indicate that the memory cell 240 is to be written to, while a "low" voltage (e.g., a logical "0") may indicate that the memory cell 240 is to be read from. The bitline 211 may be to convey the data that is to be read from, or written to, the memory cell 240.

Similarly to FIG. 1, it will be understood that this depiction of a memory cell 240 is intended as a highly simplified embodiment for the sake of discussion. The specific relative sizes of various elements, the specific shapes or positions of certain elements, etc. may vary in other embodiments.

Figure 3:
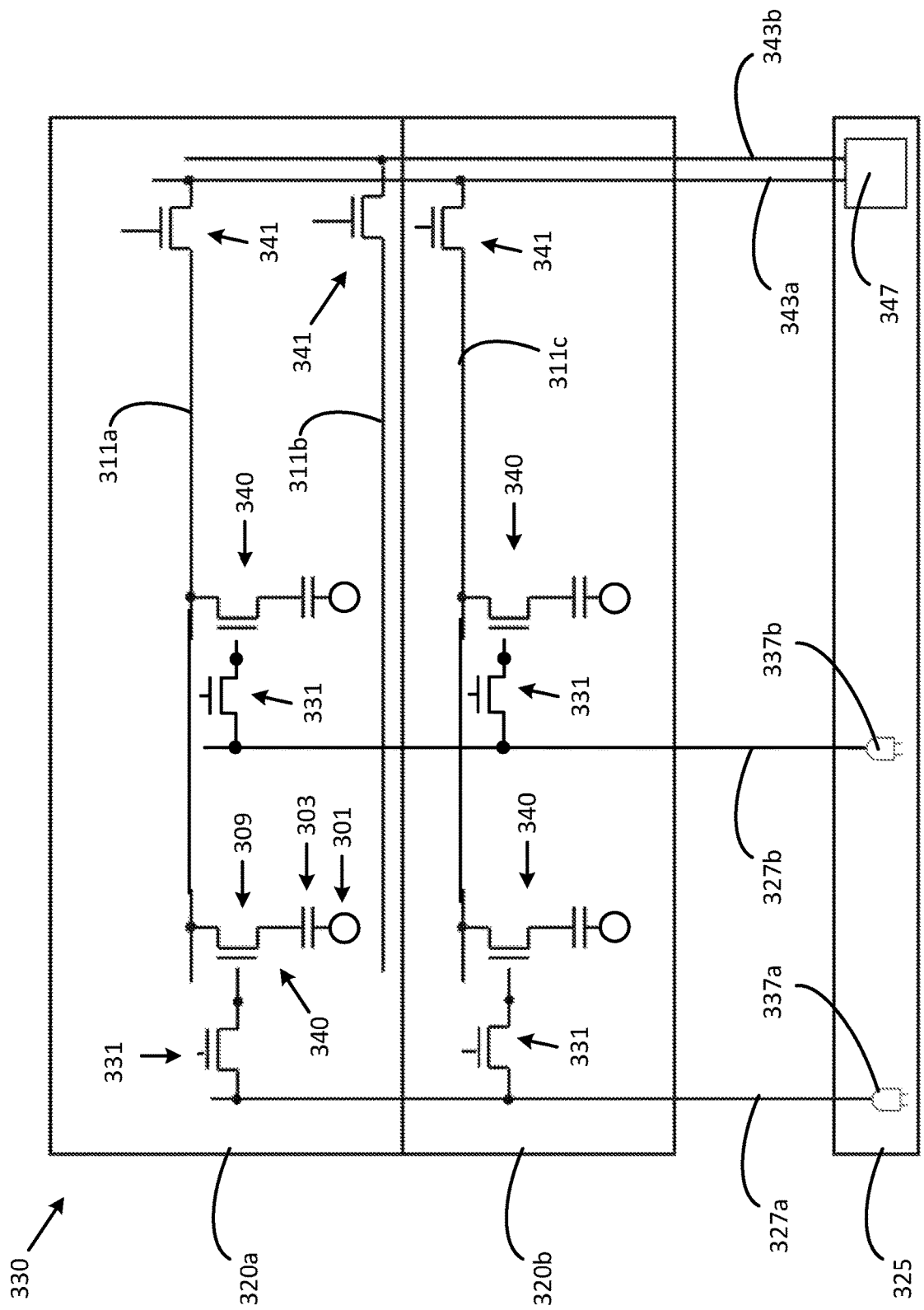
FIG. 3 depicts an example circuit architecture of a 3D monolithic memory die, in accordance with various embodiments.

FIG. 3 depicts an example circuit architecture of a memory die 330, in accordance with various embodiments. The memory die 330 may be similar to, for example, memory die 130 of FIG. 1. It will be understood that FIG. 3 is intended to depict a high-level example circuit architecture, and is not intended to be a complete representation of a specific circuit or a specific physical structure. For example, various real-world embodiments may have significantly more elements such as passive, active, or conductive elements, than are depicted in FIG. 3. Additionally, it will be understood that each and every element of FIG. 3 may not be labeled for the sake of clarity of the Figure. However, elements that share similar characteristics in terms of depiction, location, etc. may, unless explicitly stated to the contrary, be assumed to be similar to one another.

Generally, the memory die 330 is depicted with two NMOS layers 320a and 320b (collectively, "NMOS layers 320") which may be similar to, and share one or more characteristics with, NMOS layers 120a and 120b. The memory die 330 may further include a CMOS layer 325 which may be similar to, and share one or more characteristics with, CMOS layer 125.

The memory die 330 may further include a number of memory cells 340. The memory cells 340 may be generally similar to, and share one or more characteristics with, memory cells 140 or 240. In FIG. 3, the memory die 330 is depicted as having two NMOS layers 320a and 320b, each of which have two memory cells 340. However, it will be understood that real-world embodiments may have significantly more NMOS layers (as described above with respect to FIG. 1), and respective ones of the NMOS layers may have significantly more memory cells. Respective ones of the memory cells may include a transistor 309, a capacitor 303, and a connection to a cell plate 301 which may be respectively similar to, and share one or more characteristics with, transistor 209, capacitor 203, and cell plate 201.

The memory die may further include a number of bitlines 311a, 311b, and 311c (collectively, "bitlines 311"). Respective ones of the bitlines 311 may be similar to, and share one or more characteristics with, bitline 211. Specifically, respective ones of the bitlines 311 may carry data to be written to, or data read from, respective ones of the memory cells 340.

As may be seen in FIG. 3, one of the source or the drain of a transistor 309 may be coupled with a bitline such as bitlines 311a or 311c, while the other of the source or the drain of the transistor 309 may be coupled with the cell plate 301. In some embodiments, an NMOS layer may have two bitlines 311a and 311b, for example as depicted in NMOS layer 320a, while in other embodiments the NMOS layer may have a single bitline such as bitline 311c of NMOS layer 320b. In some embodiments, the two bitlines 311a and 311b may be desirable because they may allow for greater ease of reading data from the various memory cells 340 of the memory die 330.

The various memory cells 340 may be communicatively coupled with wordlines such as wordlines 327a and 327b, which may be respectively similar to, and share one or more characteristics with, wordline 227 of FIG. 2. Specifically, the gates of the transistors 309 of the memory cells 340 may be coupled with the wordlines 327a and 327b. In some embodiments, selection transistor 331 may be located between the gate of the transistor 309 and the wordline 327a or 327b. Through operation of the selection transistor 331, a given memory cell 340 may be selected dependent on whether the selection transistor 331 is open or closed.

The wordlines 327a and 327b may be communicatively coupled with decoders 337a and 337b in the CMOS layer 325 as shown. The decoders 337a and 337b may be implemented as circuitry or logic in hardware, software, firmware, or combinations thereof. Generally, the decoders 337a and 337b may be configured to perform memory address decoding or data routing for read or write of the various memory cells 340.

The CMOS layer 325 may additionally include a sensing amplifier 347 which may be coupled with the various bitlines 311a, 311b, and 311c by sensing lines 343a and 343b. By sensing variations in the voltage of a particular bitline 311a/311b/311c, the sensing amplifier 347 may be able to identify data in a particular memory cell 340. In some embodiments, the memory die 330 may include further selection transistors 341 which may be opened or closed to allow the sensing amplifier 347 to read a value of a particular bitline 311a/311b/311c. Generally, through application of voltage changes in the decoders 337a/337b and selection of a sensing transistors 331 and 341, one or more memory cells 340 of the memory die 330 may be identified by a sensing amplifier 347, or data may be written to a given memory cell 340.

Similarly to other Figures herein, it will be understood that the embodiment of FIG. 3 is intended as a high-level example embodiment, and other embodiments may vary with respect to the number of elements, the particular configuration of the elements, etc.

Figure 4:
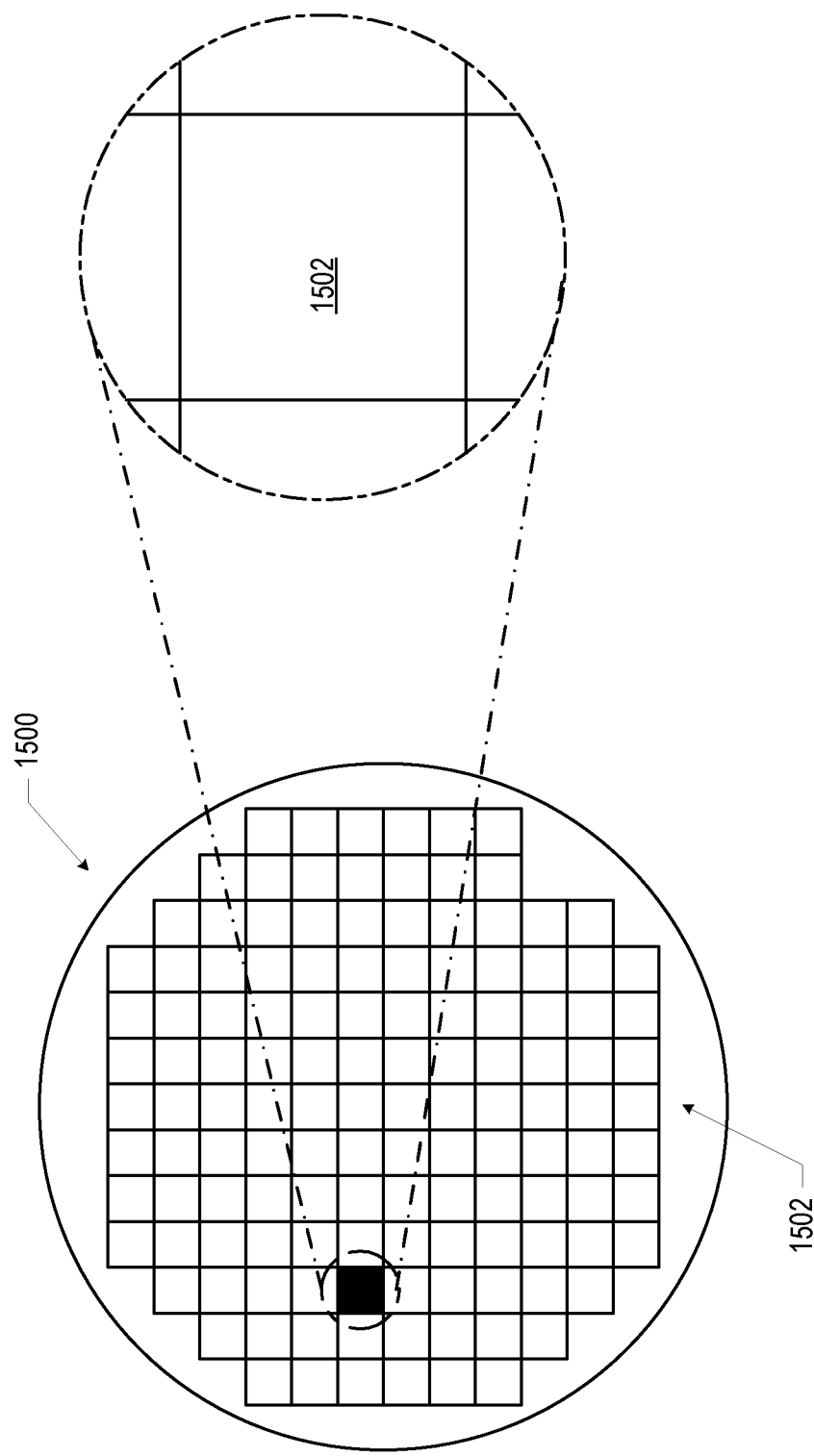
FIG. 4 is a top view of a wafer and dies that may be or include a 3D monolithic memory die, in accordance with various embodiments.

FIG. 4 is a top view of a wafer 1500 and dies 1502 that may be or include a 3D monolithic memory die, or may be included in an IC package including one or more 3D monolithic memory dies in accordance with various embodiments. The wafer 1500 may be composed of semiconductor material and may include one or more dies 1502 having IC structures formed on a surface of the wafer 1500. Each of the dies 1502 may be a repeating unit of a semiconductor product that includes a suitable IC. After the fabrication of the semiconductor product is complete, the wafer 1500 may undergo a singulation process in which the dies 1502 are separated from one another to provide discrete "chips" of the semiconductor product. The die 1502 may include one or more 3D monolithic memory dies, one or more transistors or supporting circuitry to route electrical signals to the transistors, or some other IC component. In some embodiments, the wafer 1500 or the die 1502 may include a memory device (e.g., a random-access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 6) or other logic that is configured to store information in the memory devices or execute instructions stored in the memory array.

Figure 5:
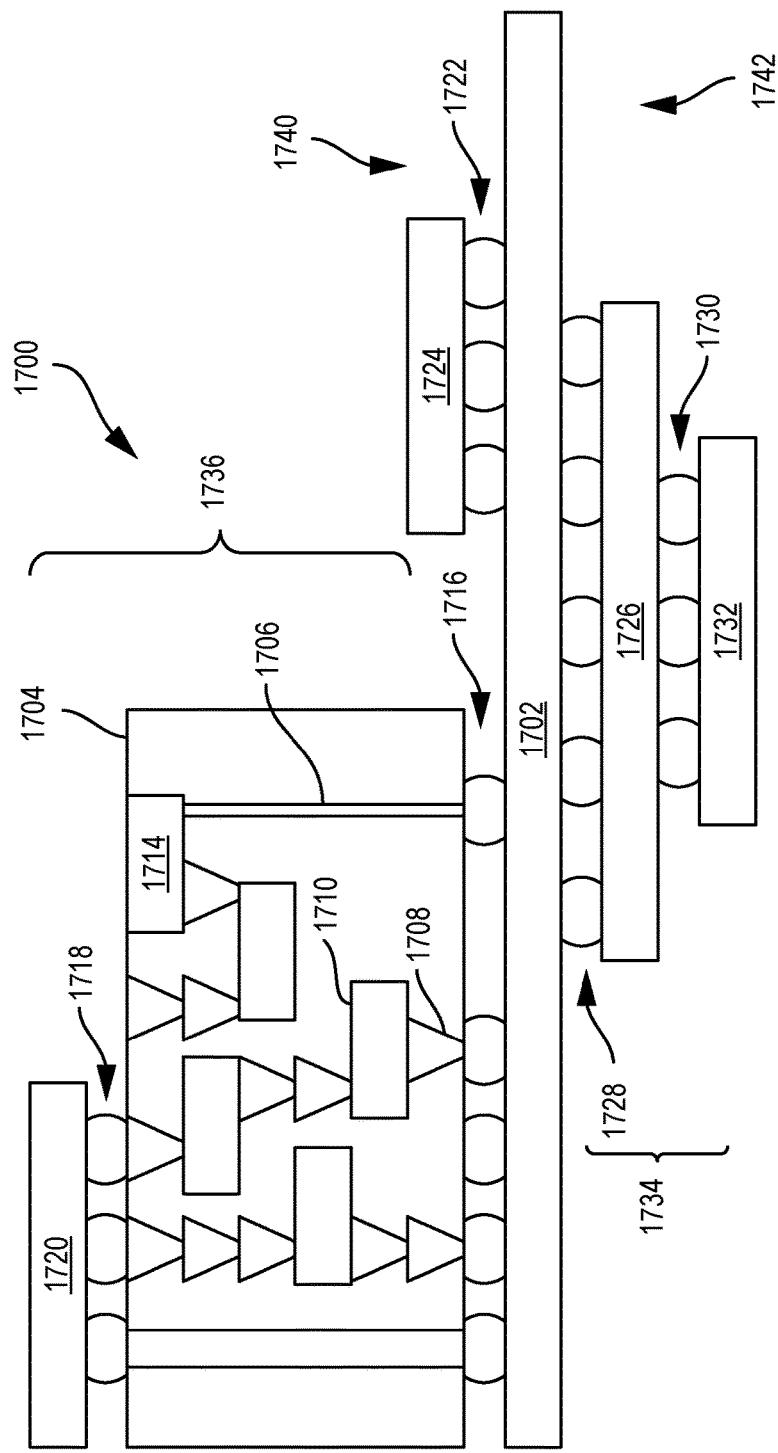
FIG. 5 is a side, cross-sectional view of an integrated circuit (IC) device assembly that may include a microelectronic package with a 3D monolithic memory die, in accordance with various embodiments.

FIG. 5 is a side, cross-sectional view of an IC device assembly 1700 that may include one or more IC packages or other electronic components (e.g., a die) including one or more 3D monolithic memory dies, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 5 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 5), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 5, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 4), an IC device, or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 5, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art. In some embodiments, the package interposer 1704 may include one or more 3D monolithic memory dies.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 5 includes a POP structure 1734 coupled to the second face 1742 of the circuit board 1702 by coupling components 1728. The POP structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The POP structure 1734 may be configured in accordance with any of the POP structures known in the art.

Figure 6:
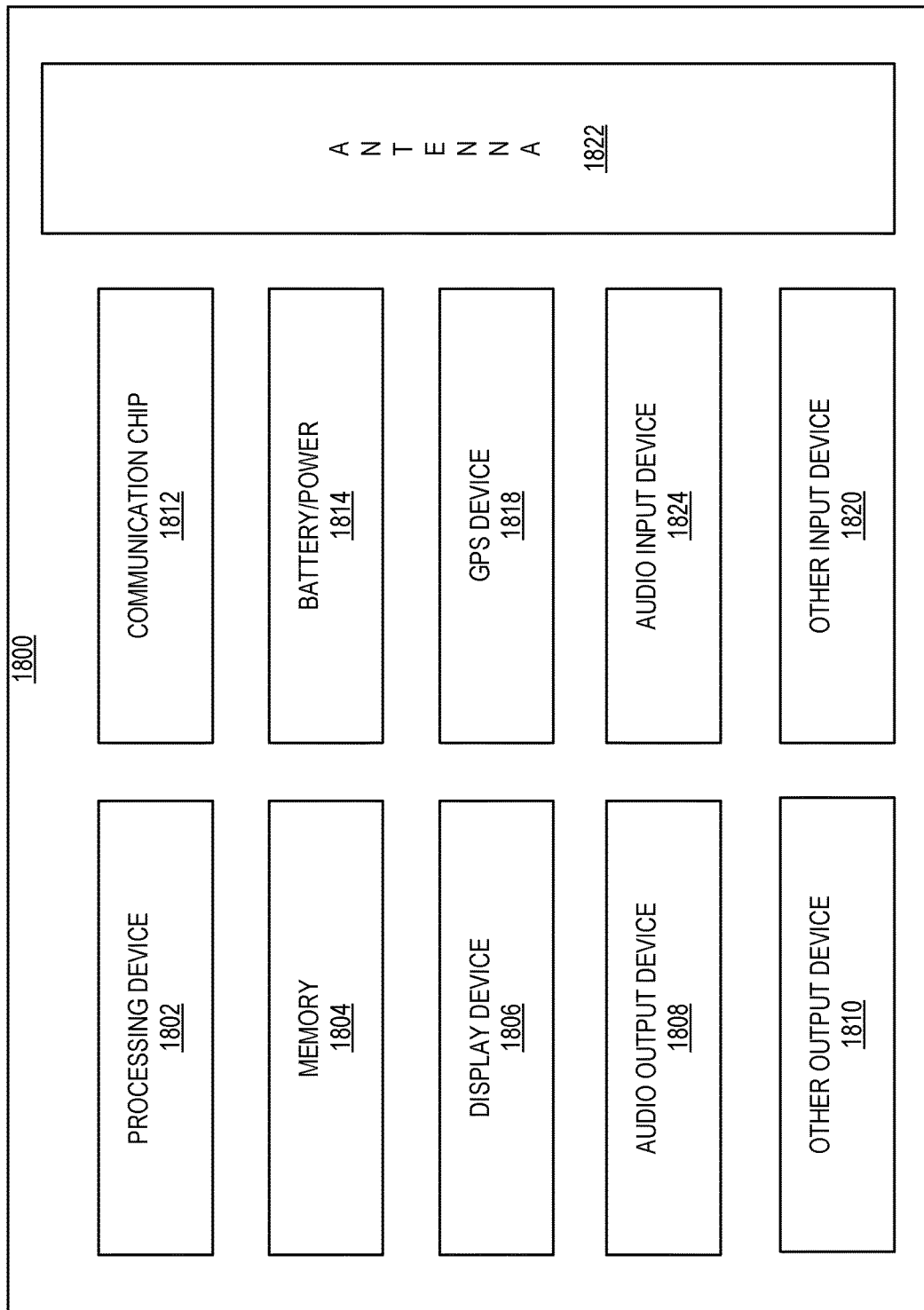
FIG. 6 is a block diagram of an example electrical device that may include a microelectronic package with a 3D monolithic memory die, in accordance with various embodiments.

FIG. 6 is a block diagram of an example electrical device 1800 that may include one or more 3D monolithic memory die, in accordance with any of the embodiments disclosed herein. For example, any suitable ones of the components of the electrical device 1800 may include one or more of the IC device assemblies 1700, IC packages, IC devices, or dies 1502 disclosed herein. A number of components are illustrated in FIG. 6 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single SOC die.

Additionally, in various embodiments, the electrical device 1800 may not include one or more of the components illustrated in FIG. 6, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific ICs (ASICs), CPUs, GPUs, cryptoprocessors (specialized processors that execute cryptographic algorithms within hardware), server processors, or any other suitable processing devices. The electrical device 1800 may include a memory 1804, which may itself include one or more memory devices such as volatile memory (e.g., DRAM), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded DRAM (eDRAM) or spin transfer torque magnetic RAM (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include another output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include another input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

Examples of Various Embodiments

Example 1 includes a microelectronic package comprising: a package substrate; an active die; and a memory die communicatively coupled with the package substrate and the active die, wherein the memory die includes: a first memory cell at a first layer of the memory die; a second memory cell at a second layer of the memory die; and a via in the memory die that communicatively couples the active die with the package substrate.

Example 2 includes the microelectronic package of example 1, wherein the memory die is between the package substrate and the active die.

Example 3 includes the microelectronic package of example 1, wherein an active side of the memory die is coupled with an active side of the active die by an interconnect.

Example 4 includes the microelectronic package of example 1, wherein the memory die has a z-height between 100 micrometers ("microns") and 150 microns.

Example 5 includes the microelectronic package of example 1, wherein the memory die has a memory capacity between 4 gigabytes (GB) and 16 GB.

Example 6 includes the microelectronic package of example 1, wherein the active die and the memory die are communicatively coupled with the package substrate by an interconnect that is different than a wirebond.

Example 7 includes the microelectronic package of any of examples 1-6, wherein the memory die further includes a third memory cell at a first layer of the memory die.

Example 8 includes the microelectronic package of any of examples 1-6, wherein the first memory cell is a memory die.

Example 9 includes the microelectronic package of any of examples 1-6, wherein the first memory cell is a DRAM cell that includes a MOSFET.

Example 10 includes the microelectronic package of example 9, wherein the n-type MOSFET is coupled with a wordline of the memory die, a bitline of the memory die, and a bias voltage of the memory die.

Example 11 includes an electronic device comprising: an antenna to facilitate wireless communication between the electronic device and another electronic device; and a microelectronic package communicatively coupled with the antenna, wherein the microelectronic package includes: a memory die communicatively coupled with a package substrate of the electronic device, wherein the memory die includes a first memory cell at a first layer of the memory die and a second memory cell at a second layer of the memory die; and a SOC communicatively coupled with the package substrate of the electronic device by a conductive element in the memory die.

Example 12 includes the electronic device of example 11, wherein the memory die has a z-height of less than 150 micrometers ("microns").

Example 13 includes the electronic device of example 11, wherein the memory die has a memory capacity between 4 gigabytes (GB) and 16 GB.

Example 14 includes the electronic device of example 11, wherein the first memory cell is a DRAM cell that includes MOSFET.

Example 15 includes the electronic device of any of examples 11-14, wherein the memory die is between the SOC and the package substrate.

Example 16 includes the electronic device of any of examples 11-14, wherein the SOC is communicatively coupled with the package substrate by an interconnect that is different than a wirebond.

Example 17 includes a microelectronic package comprising: a memory die communicatively coupled with a package substrate of the electronic device, wherein the memory die includes: a first memory cell at a first layer of the memory die, wherein the first memory cell includes a first a DRAM cell with a MOSFET; a second memory cell at a second layer of the memory die, wherein the second memory cell includes a second DRAM cell with an n-type MOSFET; and a conductive element; and a SOC communicatively coupled with the package substrate of the electronic device by the conductive element in the memory die.

Example 18 includes the microelectronic package of example 17, wherein the memory die has a z-height of less than 100 micrometers ("microns").

Example 19 includes the microelectronic package of example 17, wherein the memory die has a memory capacity between 4 gigabytes (GB) and 16 GB.

Example 20 includes the microelectronic package of any of examples 17-19, wherein the n-type MOSFET of the first memory cell is coupled with a wordline of the memory die, a bitline of the memory die, and a bias voltage of the memory die.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. A microelectronic package comprising:
   a package substrate;
   an active die; and
   a memory die communicatively coupled with the package substrate and the active die, wherein the memory die includes:
     a first memory cell at a first n-type metal-oxide-semiconductor (NMOS) layer of the memory die;
     a second memory cell at a second NMOS layer of the memory die;
     a complimentary metal-oxide semiconductor (CMOS) layer comprising control logic for the memory die; and
     a via in the memory die that communicatively couples the active die with the package substrate.

2. The microelectronic package of claim 1, wherein the memory die is between the package substrate and the active die.

3. The microelectronic package of claim 1, wherein an active side of the memory die is coupled with an active side of the active die by an interconnect.

4. The microelectronic package of claim 1, wherein the memory die has a z-height between 100 micrometers ("microns") and 150 microns as measured perpendicularly to a face of the package substrate.

5. The microelectronic package of claim 1, wherein the memory die has a memory capacity between 4 gigabytes (GB) and 16 GB.

6. The microelectronic package of claim 1, wherein the active die and the memory die are communicatively coupled with the package substrate by an interconnect that is different than a wirebond.

7. The microelectronic package of claim 1, wherein the memory die further includes a third memory cell at a first layer of the memory die.

8. The microelectronic package of claim 1, wherein the first memory cell is a dynamic random-access memory (DRAM) cell that includes an n-type metal-oxide-semiconductor field-effect transistor (MOSFET).

9. The microelectronic package of claim 8, wherein the n-type MOSFET is coupled with a wordline of the memory die, a bitline of the memory die, and a bias voltage of the memory die.

10. An electronic device comprising:
an antenna to facilitate wireless communication between the electronic device and another electronic device; and
a microelectronic package communicatively coupled with the antenna, wherein the microelectronic package includes:
a memory die communicatively coupled with a package substrate of the electronic device, wherein the memory die comprises:
a first memory cell at a first n-type metal-oxide-semiconductor (NMOS) layer of the memory die;
a second memory cell at a second NMOS layer of the memory die; and
a complimentary metal-oxide semiconductor (CMOS) layer comprising control logic for the memory die; and
a system-on-chip (SOC) communicatively coupled with the package substrate of the electronic device by a conductive element in the memory die.

11. The electronic device of claim 10, wherein the memory die has a z-height of less than 150 micrometers ("microns") as measured perpendicularly to a face of the package substrate.

12. The electronic device of claim 10, wherein the memory die has a memory capacity between 4 gigabytes (GB) and 16 GB.

13. The electronic device of claim 10, wherein the first memory cell is a dynamic random-access memory (DRAM) cell that includes an n-type metal-oxide-semiconductor field-effect transistor (MOSFET).

14. The electronic device of claim 10, wherein the memory die is between the SOC and the package substrate.

15. The electronic device of claim 10, wherein the SOC is communicatively coupled with the package substrate by an interconnect that is different than a wirebond.

16. A microelectronic package comprising:
a memory die communicatively coupled with a package substrate of the microelectronic package, wherein the memory die comprises:
a first memory cell at a first n-type metal-oxide-semiconductor (NMOS) layer of the memory die, wherein the first memory cell includes a first dynamic random-access memory (DRAM) cell with an n-type metal-oxide-semiconductor field-effect transistor (MOSFET);
a second memory cell at a second NMOS layer of the memory die, wherein the second memory cell includes a second DRAM cell with an n-type MOSFET;
a complimentary metal-oxide semiconductor (CMOS) layer comprising control logic for the memory die; and
a conductive element; and
a system-on-chip (SOC) communicatively coupled with the package substrate of the microelectronic package by the conductive element in the memory die.

17. The microelectronic package of claim 16, wherein the memory die has a z-height of less than 100 micrometers ("microns") as measured perpendicularly to a face of the package substrate.

18. The microelectronic package of claim 16, wherein the memory die has a memory capacity between 4 gigabytes (GB) and 16 GB.

19. The microelectronic package of claim 16, wherein the n-type MOSFET of the first memory cell is coupled with a wordline of the memory die, a bitline of the memory die, and a bias voltage of the memory die.

* * * * *